United States Patent
Watanabe

(10) Patent No.: US 7,083,677 B2
(45) Date of Patent: Aug. 1, 2006

(54) SILICON SEED CRYSTAL AND METHOD FOR MANUFACTURING SILICON SINGLE CRYSTAL

(75) Inventor: Masayuki Watanabe, Kanagawa (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 10/921,303

(22) Filed: Aug. 19, 2004

(65) Prior Publication Data

US 2005/0076826 A1  Apr. 14, 2005

(30) Foreign Application Priority Data

Aug. 21, 2003  (JP) ............ P. 2003-297416

(51) Int. Cl.
*C30B 15/00* (2006.01)

(52) U.S. Cl. .................. 117/13; 117/19; 117/20

(58) Field of Classification Search .......... 117/13, 117/19, 20

See application file for complete search history.

(56) References Cited

U.S. PATENT DOCUMENTS 5,911,822 A  6/1999  Abe et al.
6,869,477 B1 *  3/2005  Haga et al. ............ 117/13
6,893,499 B1 *  5/2005  Fusegawa et al. ........ 117/13

FOREIGN PATENT DOCUMENTS

| JP | 4-139092 A | 5/1992 |
|---|---|---|
| JP | 8-319192 A | 3/1996 |
| JP | 10-203898 A | 8/1998 |
| JP | 2001-199789 A | 7/2001 |

\* cited by examiner

*Primary Examiner*—Felisa Hiteshew
(74) *Attorney, Agent, or Firm*—Foley & Lardner LLP

(57) ABSTRACT

Using a seed crystal comprising a silicon single crystal not including a vacancy excess region, a neck comprising a silicon single crystal not including a vacancy excess region is grown with a diameter contracted smaller than, or equal to that of the contact surface of the silicon seed crystal in contact with a raw material silicon melt, and necking is performed so that the length L of the neck satisfies $L \geq d \cdot (\cot \psi)$, where d denotes the length of the diameter or the diagonal of the contact surface of the silicon seed crystal in contact with the raw material silicon melt, and $\psi$ denotes the angle formed between the propagation direction of dislocations and the growth direction of the neck, and then the silicon single crystal is grown with the diameter expanded.

20 Claims, 1 Drawing Sheet

SILICON SEED CRYSTAL AND METHOD FOR MANUFACTURING SILICON SINGLE CRYSTAL

BACKGROUND OF THE INVENTION

1. Field of the Invention

The present invention relates to a silicon seed crystal and a method for manufacturing a silicon single crystal. More particularly, it relates to a silicon seed crystal to be preferably used for pulling up of a large-diameter and high-weight silicon single crystal ingot by a Czochralski Method (CZ method), and a method for manufacturing a silicon single crystal using the same.

2. Description of the Related Art

In the manufacturing of a silicon single crystal by the CZ method, a seed crystal made of a silicon -single crystal is brought in contact with a raw material silicon melt, and then slowly pulled up while being rotated, thereby growing a single crystal ingot.

With the CZ method, when a seed crystal is brought in contact with the raw material silicon melt, slip dislocations occur in high density in the seed crystal by thermal shock.

Conventionally, the following method has been adopted. In order to eliminate the dislocations which propagate from the slip dislocations to a single crystal to be grown, a necking step of forming a neck reduced in diameter to about 3 mm is performed, and then, the single crystal is increased in size to a prescribed diameter. As a result, a dislocation-free silicon single crystal is pulled up. Such necking from the seed crystal is widely known as the Dash Necking method, which has been a common method in the manufacturing of a silicon single crystal by the CZ method.

However, with the Dash Necking method, the strength is insufficient for supporting the single crystal ingot increased in weight with a recent trend of an increase in diameter of a silicon single crystal. This might have caused a serious accident such as the dropping of the single crystal ingot due to the fracture of the neck in the pulling-up process of the single crystal ingot.

Under such circumstances, various studies have been made to form a thick neck by the use of a large-diameter seed crystal.

However, the following problem has occurred. The larger the diameter of the seed crystal is, the larger the heat capacitance in the tip portion of the seed crystal in contact with a raw material silicon melt becomes. For this reason, at the instant when the seed crystal comes in contact with the raw material silicon melt, a temperature difference is suddenly caused in the seed crystal. This causes slip dislocations to become more likely to occur in high density.

In response to such a problem, there are disclosed a kind of the method in which a seed crystal is thermally insulated or heated on a raw material silicon melt, thereby to reduce the initial dislocation density, or the shape of the seed crystal is inverted, thereby to reduce the thermal shock upon contact with the melt such as disclosed in JP-A-8-319192 or JP-A-10-203898.

Whereas, there is disclosed a method in which a seed crystal is doped with boron (B) or germanium (Ge) in a high concentration, thereby to reduce the slip dislocations occurring upon contact of the seed crystal with the melt such as disclosed in JP-A-4-139092 or JP-A-2001-199789.

However, with such a method of thermal insulation or heating of a seed crystal as disclosed in JP 8-319192, or such a method using a seed crystal of a specific shape as disclosed in JP 10-203898, there is a limitation on the thickness of the neck. Accordingly, the method is not satisfactorily adaptable to a single crystal ingot which is large in diameter and high in weight, and it cannot necessarily also be said that the dislocation-free rate is enough.

Whereas, with such a method using a B-doped seed crystal as disclosed in JP 4-139092, B which is an impurity for changing the resistivity of the crystal is added. For this reason, unfavorably, the method cannot be used for purposes other than the manufacturing of a low resistivity crystal.

Further, such a method using a Ge-doped seed crystal as disclosed in JP2001-199789 is suitable for the manufacturing of a Ge-doped silicon single crystal or a mixed crystal of Si/Ge. However, it cannot be utilized for the manufacturing of a high purity silicon single crystal for which the mixing of Ge is not preferable.

Therefore, there has been a demand for a method capable of growing a thick and short neck simply without using the seed crystal of a specific shape or doped with a specific high-concentration impurity as described above.

Under such circumstances, the present inventors have conducted a study on the following method. For the growth of a silicon single crystal ingot in conformity with the trend toward a larger diameter and a higher weight, a thick and short neck capable of supporting the whole weight of the single crystal by only a seed crystal and a neck grown from the seed crystal is grown without depending upon a means for thermally insulating or heating the seed crystal, or without using a seed crystal doped with a high-concentration impurity leading to the mixing of an excess impurity, or a seed crystal of a specific shape not capable of being used repeatedly. Thus, they completed the invention.

SUMMARY OF THE INVENTION

The invention was accomplished in order to solve the aforementioned technical problem. It is an object of the invention to provide a silicon seed crystal capable of suppressing the occurrence of dislocations in a single crystal to be grown in silicon single crystal pulling-up by the Czochralski method.

Further, it is another object of the invention to provide a method for manufacturing a silicon single crystal in which a thick and short neck is formed in a dislocation-free state using the seed crystal, thereby to improve the productivity of a large-diameter high-weight single crystal ingot.

More specifically, the method for manufacturing said sort of silicon single crystal is performed by a silicon seed crystal for use in silicon single crystal pulling-up by a Czochralski method, characterized by having a contact surface with a raw material silicon melt, at least the contact surface being a silicon single crystal not including a vacancy excess region.

The method using such a silicon single crystal without including a vacancy excess region as a seed crystal suppresses the occurrence of slip dislocations upon contact of the seed crystal with the raw material silicon melt and during neck growth. For this reason, it is possible to grow a thick and short neck in a dislocation-free state, resulting in an increase in mechanical strength of the neck. This enables the requirements caused by the trend of the increase in diameter and the increase in weight of a single crystal ingot to be satisfactorily met.

In the silicon seed crystal, it is preferable that the silicon single crystal not including a vacancy excess region is a defect-free region not including an interstitial silicon excess region, and not including a ring OSF region. In the silicon seed crystal, the silicon single crystal not including a vacancy excess region Use of such a seed crystal comprising a silicon single crystal of a defect-free region further increases the mechanical strength of the seed crystal, and still further reduces the occurrence of slip dislocations.

Incidentally, the vacancy excess region herein referred to is also called a V-rich region, which is a region where a large number of void type grown-in defects are present due to the lack of silicon atoms.

Whereas, the interstitial silicon excess region is also called an I-rich region, which is a region where a large number of defects such as dislocation clusters are present due to the dislocations occurring because of the presence of an excess amount of silicon atoms.

Whereas, the method for manufacturing a silicon single crystal in accordance with the invention is a method for manufacturing a silicon single crystal by single crystal pulling-up with a Czochralski method, characterized by, using a seed crystal comprising a silicon single crystal not including a vacancy excess region, growing a neck comprising a silicon single crystal not including a vacancy excess region with a diameter contracted smaller than, or equal to that of the contact surface of the silicon seed crystal with a raw material silicon melt, and performing necking so that the length L of the neck satisfies $L \geq d \cdot (\cot \psi)$, where d denotes the length of the diameter or the diagonal of the contact surface of the silicon seed crystal in contact with the raw material silicon melt, and $\psi$ denotes the angle formed between the propagation direction of dislocations and the growth direction of the neck, and then growing the silicon single crystal with the diameter expanded.

The manufacturing method not only can suppress the occurrence of dislocations due to a thermal shock at the contact surface of the seed crystal with the raw material silicon melt, but also can suppress another occurrence of dislocations during neck growth. Further, even when the dislocations due to the thermal shock slightly remain, the dislocations are also suppressed from propagating, and eliminated with efficiency during neck growth. This can bring the single crystal to be grown into a dislocation-free state.

Incidentally, the contracted diameter or the equal diameter herein referred to denotes the diameter of the neck when the neck is grown from the seed crystal. The neck diameter is referred to as a contracted diameter when it is contracted smaller than the crystal diameter at the contact surface of the raw material silicon melt and the seed crystal. Whereas, the neck diameter is referred to as an equal diameter when it is roughly equal to the crystal diameter at the contact surface.

The neck is preferably a silicon single crystal of a defect-free region which does not include a vacancy excess region, and does not include an interstitial silicon excess region and a ring OSF region.

Thus, by forming not only the seed crystal but also the neck with a defect-free region, it becomes possible to form a thick and short neck with ease. This also can eliminate the slip dislocations occurred in low density with reliability. For this reason, it is possible to grow a dislocation-free silicon single crystal in conformity with a trend of an increase in diameter and an increase in weight.

As described above, by using the single crystal in accordance with the invention, it is possible to suppress the occurrence of slip dislocations upon contact of a seed crystal with a raw material silicon melt in silicon single crystal pulling-up by the Czochralski method.

Further, it is possible to realize a dislocation-free state in a thick and short neck without using a means for thermally insulating or heating the seed crystal resulting in a complicated apparatus configuration, and without adding excess impurities such as B and Ge.

Whereas, with the method for manufacturing a silicon single crystal in accordance with the invention, it is possible to grow a dislocation-free single crystal with efficiency.

Therefore, the method becomes capable of satisfactorily meeting the requirements for the growth of a recent silicon single crystal ingot increased in diameter to 200 mm (8 inches) to 400 mm (16 inches), or more, and increased in weight. Accordingly, the method can contribute to the improvement of the productivity, yield, and manufacturing cost of a dislocation-free silicon single crystal.

DESCRIPTION OF THE PREFERRED EMBODIMENTS

Figure 1:
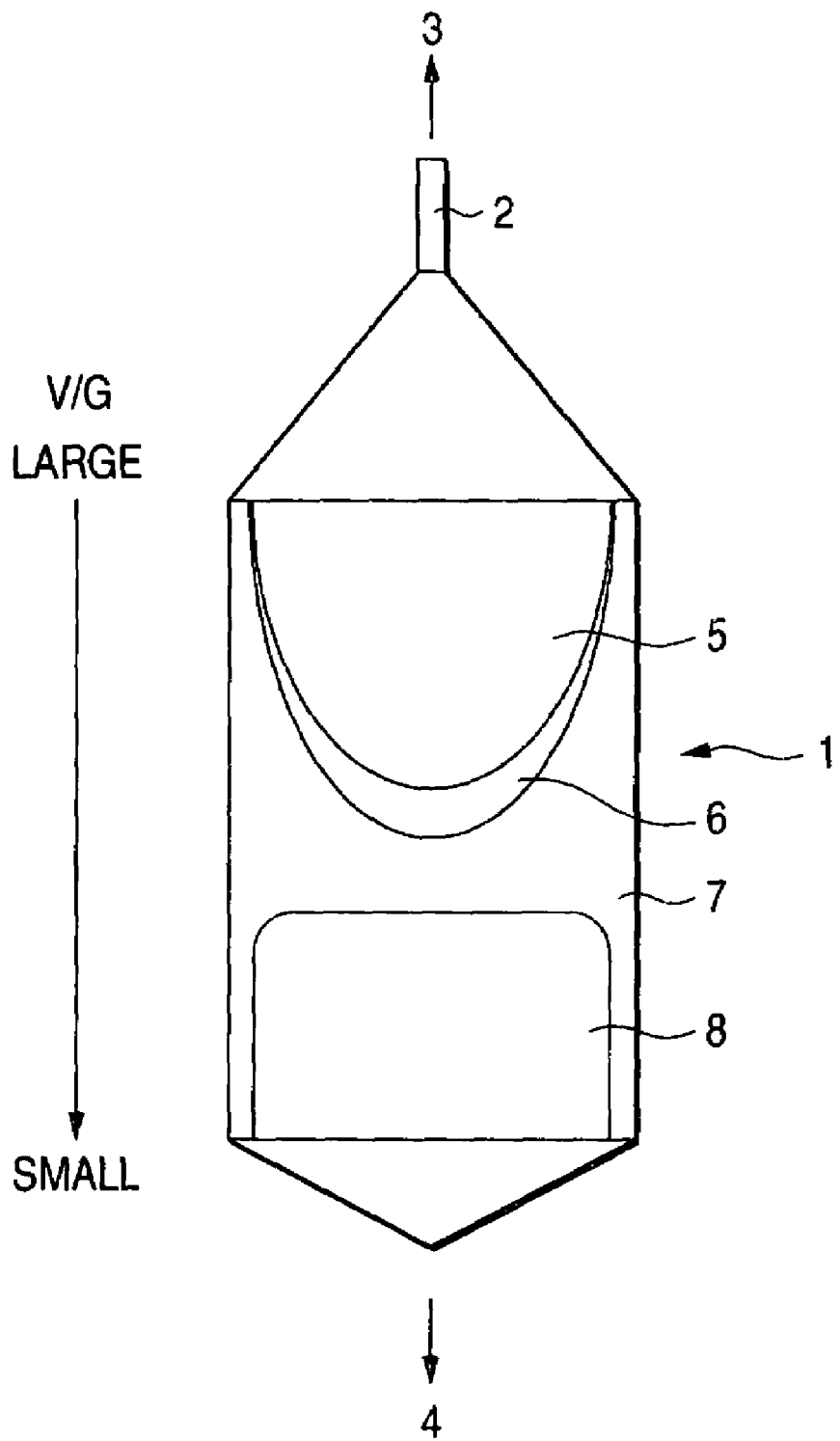
FIG. 1 is a cross sectional view schematically showing the relationship between the V/G value and the point defect distribution in a silicon single crystal ingot.

Below, the invention will be described in more details.

A silicon seed crystal in accordance with the invention is a silicon seed crystal for use in silicon single crystal pulling-up by a Czochralski method, characterized by having a contact surface with a raw material silicon melt, at least the contact surface being a silicon single crystal not including a vacancy excess region.

Thus, by using a silicon single crystal not including a vacancy excess region as a seed crystal, it is possible to improve the strength of the seed crystal. For example, when the seed crystal has a strength equal to, or larger than the thermal stress generated at the instant when the seed crystal has come in contact with the raw material silicon melt, it can be brought in contact with the raw material silicon melt without generating slip dislocations.

Further, the slip dislocations are suppressed from occurring even during dipping in the raw material silicon melt.

Namely, no inclusion of a vacancy excess region in the seed crystal suppresses slip dislocations from occurring upon contact of the seed crystal with the raw material silicon melt, and allows effective elimination of slip dislocations even for a thick and short neck. Thus, another occurrence of a slip dislocation during neck growth is also suppressed.

Therefore, it is possible to grow a thick and short neck in a dislocation-free state, resulting in an increase in mechanical strength of the neck, which satisfies the requirements in the trend of the increase in diameter and the increase in weight of a silicon single crystal ingot.

Incidentally, it is known that the ratio V/G of the pull rate V and the temperature gradient G at a pulled crystal-melt interface in the pulling-up of a silicon single crystal can determine the type and the concentration of the point defect.

Therefore, by controlling the pull rate V in accordance with G determined by a hot zone configuration, it is possible to grow a single crystal not including a vacancy excess region, and it is also possible to suppress the occurrence of voids.

Namely, in a silicon single crystal, it is possible to control the void concentration and suppress the formation of voids, being regarded as agglomeration defects, without need for adding unnecessary impurities so as to realize the ease control during the single crystal growth.

FIG. 1 schematically shows the relationship between the V/G value and the point defect distribution in the single crystal ingot.

As shown in FIG. 1, when the pull rate of a single crystal ingot 1 is gradually decreased from a head 3 side toward a tail 4 side after growing a neck 2, the V/G value also decreases. With this, the point defect distribution in the single crystal ingot 1 also changes. Incidentally, the change in G at this step is small.

When the pull rate is large, namely, the V/G value is large, a vacancy excess region 5 is formed, and vacancies agglomerate to form void defects.

Then, when the V/G value is equal to, or less than the critical V/G value at which the vacancy excess region 5 disappears, first, a ring OSF region 6 is formed, and then, a defect-free region 7 is formed due to the balance between the void and interstitial silicon concentrations.

When the V/G value further decreases, an interstitial silicon excess region 8 is formed, and interstitial silicon agglomeration defects are formed.

Conventionally, such a crystal of the vacancy excess region grown at an ordinary pull rate as described above has been used as a seed crystal. The crystal of the region not including a vacancy excess region which is a low-rate pulled crystal inferior in productivity has not been used as seed crystal intentionally.

In contrast, the invention is characterized in that the silicon single crystal not including a vacancy excess region excellent in dislocation occurrence suppressing effect is used as a seed crystal.

Incidentally, in the silicon seed crystal, the whole seed crystal is not necessarily required to be a single crystal not including a vacancy excess region. The foregoing effects can be obtained satisfactorily so long as at least the contact surface with the raw material silicon melt is the one not including a vacancy excess region.

Whereas, the silicon seed crystal is preferably a silicon single crystal not including a vacancy excess region, and in addition, further a defect-free region not including an interstitial silicon excess region, and not including a ring OSF region.

Thus, by using a silicon single crystal of a defect-free region as a seed crystal, the mechanical strength of the seed crystal further increases. This enables slip dislocations to be still more reduced.

Whereas, the method for manufacturing a silicon single crystal in accordance with the invention is a method for manufacturing a silicon single crystal by single crystal pulling-up with a Czochralski method, in which, using a seed crystal comprising a silicon single crystal not including a vacancy excess region, a neck comprising a silicon single crystal not including a vacancy excess region is grown with a diameter contracted smaller than, or equal to that of the contact surface of the silicon seed crystal in contact with a raw material melt.

Further, necking is performed so that the length L of the neck satisfies $L \geq d \cdot (\cot \psi)$, where d denotes the length of the diameter or the diagonal of the contact surface of the silicon seed crystal in contact with the raw material silicon melt, and $\psi$ denotes the angle formed between the propagation direction of dislocations and the growth direction of the neck, and then, the silicon single crystal is grown with the diameter expanded.

Thus, by performing necking by the use of a silicon single crystal not including a vacancy excess region as a seed crystal, it is possible to reduce the occurrence of slip dislocations, resulting in an increase in mechanical strength of the single crystal. This enables the formation of a thicker and shorter neck than in the related art.

Further, by growing a neck comprising a silicon single crystal not including a vacancy excess region, it is possible not only to suppress the occurrence of dislocations due to a thermal shock at the contact surface of the seed crystal with the raw material silicon melt, but also to suppress another occurrence of dislocations during neck growth.

Still further, even when the dislocations due to the thermal shock slightly remain, the dislocations are also suppressed from propagating, and eliminated with efficiency during neck growth.

For this reason, it becomes possible to form a thick and short neck with ease. Accordingly, even when slip dislocations occur, they can be eliminated with reliability. This enables the growth of a dislocation-free single crystal in conformity with the trend of an increase in diameter and an increase in weight.

It is preferable to grow a neck comprising a silicon single crystal of a defect-free region which does not include a vacancy excess region, and in addition, further does not include an interstitial silicon excess region and a ring OSF region by controlling the pull rate in the necking.

Thus, by forming not only the seed crystal but also the neck with a defect-free region, it becomes possible to form a thick and short neck with ease, and it becomes possible to eliminate slip dislocations occurred in low density with reliability.

As described above, in order to implement the dislocation-free state of a single crystal, it is most effective to grow a neck of a defect-free region using a seed crystal of a defect-free region. In accordance with the invention, a single crystal in which a ring OSF region, a defect-free region, and an interstitial silicon excess region are mixed is pulled, avoiding only a vacancy excess region. Thus, a seed crystal is obtained by processing the single crystal so that only the contact surface with a raw material silicon melt becomes a defect-free region. When the resulting seed crystal is used, it is possible to satisfactorily obtain the foregoing effect.

The V/G value capable of providing a crystal of a defect-free region is restricted to a very narrow range. For this reason, it is difficult to pull up the silicon single crystal for a seed crystal with good productivity so that the whole region is a defect-free region. From this point of view and also from the point of view of the production efficiency, it is preferable to use a seed crystal processed so as not to include only the vacancy excess region as described above.

Whereas, in the necking, it is preferable that the length L of the neck satisfies $L \geq d \cdot (\cot \psi)$, where d denotes the length of the diameter or the diagonal of the contact surface of the silicon seed crystal in contact with a raw material silicon melt, and $\psi$ denotes the angle formed between the propagation direction of dislocations and the growth direction of the neck.

When the neck length L satisfies the aforesaid relational expression, even in the case where dislocations are induced by disturbance at triple points of crystal-melt-atmospheric gas (solid-liquid-gas) in the outer periphery of the contact interface of the seed crystal with the raw material silicon melt, it is possible to eliminate the dislocations out of the neck with ease.

For example, for the <100> orientation pulling-up using a cylindrical seed crystal with a diameter (d) of 12.7 mm, the angle $\psi$ formed between the propagation direction of the dislocations (<110> along {111} plane) and the growth direction of the crystal is 54.74°, and the critical neck length (Lc) is 12.7×1.38=17.53 (mm).

Incidentally, when there is no propagation of a dislocation from the seed crystal, the neck length may be 0, i.e., it is also acceptable that there is no neck.

Whereas, the shape of the seed crystal has no particular restriction. The shape of the contact surface of the seed crystal with the raw material silicon melt may be either circular or polygonal. The d may be set as the diameter for a circle, and may be set with the diagonal length as an index for a polygon.

Even when the shape of the contact surface of the seed crystal with the raw material silicon melt is any of these, in the necking step, a neck is preferably formed with a diameter contracted smaller than, or equal to the contact surface until it is grown to at least the critical neck length Lc.

This can suppress another occurrence of dislocations in necking with reliability.

In the case where the diameter is increased from the time point at which the crystal is a seed crystal coming in contact with the raw material silicon melt, dislocations becomes more likely to be gathered at the triple points.

Whereas, when the diameter is increased at a neck length of less than Lc, the dislocations not yet completely removed are incorporated into the inside of the neck due to fluctuations in shape at the neck growing plane.

Incidentally, even when the neck length L is set too large, as described above, the V/G value is required to be set small, which imposes a restriction on the necking rate. If dislocations have propagated from the seed crystal to the neck, it is difficult to eliminate the dislocations in the necking step.

Therefore, it is undesirable also from the viewpoint of the relationship with the strength that the neck length L is set extremely larger than the critical neck length Lc.

Further, it is preferable that the minimum diameter of the neck is set at 6 mm or more in order to provide a satisfactory neck strength, and ensure the growth of a thick and short neck in the necking.

The neck diameter can be increased, if required, to the diameter equal to that of the seed crystal. This enables the growth of a dislocation-free single crystal in conformity with the trend of an increase in diameter and an increase in weight.

Incidentally, needless to say, the aforesaid method for manufacturing a silicon seed crystal and a silicon single crystal in accordance with the invention is not limited to the conventional Czochralski method, and is similarly applicable to a MCZ method (Magnetic field CZ method) in which a magnetic field is applied during pulling-up of a silicon single crystal. The term "Czochralski method" in the invention also includes the MCZ method.

Below, the invention will be described in more details with showing some specific examples. However, the invention is not limited to the following these examples.

EXAMPLE 1

A silicon single crystal ingot was grown by the use of a hot zone for pulling-up of a 6-inch-dia crystal and by controlling the pull rate so that roughly the middle of the ingot became a defect-free region.

From this ingot, cylindrical samples each with a diameter of 12.7 mm were extracted, thereby to manufacture 20 seed crystals each of which the contact surface with a raw material silicon melt was a defect-free region.

Each seed crystal was brought in contact with the raw material silicon melt surface, and then held at 8 mm in minimum diameter at a pull rate of 4 to 5 mm/min, to grow a 100-mm long neck.

Thereafter, the pull rate was reduced to 1.5 mm/min, and the diameter was increased to 150 mm, thereby to pull up a single crystal ingot.

Each resultant single crystal ingot was evaluated for the dislocation-free rate.

Whereas, the profile in the vicinity of the interface between the seed crystal and the neck was observed by means of an X-ray topography, thereby to determine the slip occurrence rate of the seed crystal side.

These results are shown in Table 1.

Incidentally, the dislocation-free rate (%) herein referred to is the value indicative of the proportion of the number of ingots in each of which no dislocation occurred relative to the number (20) of pulled single crystal ingots. The same applies to the following.

EXAMPLES 2 AND 3

Silicon single crystal ingots were grown so that roughly the middles of the ingots became a ring OSF region (Example 2) and an interstitial silicon excess region (Example 3), respectively, under the same conditions as those in Example 1, except for control of only the pull rate.

From the ingots, cylindrical samples each with a diameter of 12.7 mm were extracted, thereby to manufacture 20 seed crystals of which the contact surfaces with the raw material silicon melt were a ring OSF region (Example 2) and an interstitial silicon excess region (Example 3), respectively. By the use of these seed crystals, each single crystal ingot was pulled up to be evaluated for the dislocation-free rate and the seed crystal-side slip occurrence rate in the same manner as with Example 1. These results are shown Table 1.

COMPARATIVE EXAMPLE

A silicon single crystal ingot was grown so that roughly the middle of the ingot became a vacancy excess region under the same conditions as with Example 1.

From the ingot, a cylindrical sample with a diameter of 12.7 mm was extracted, thereby to manufacture 20 seed crystals each of which the contact surface with the raw material silicon melt was a vacancy excess region. By the use of these seed crystals, each single crystal ingot was pulled up to be evaluated for the dislocation-free rate and the seed crystal-side slip occurrence rate in the same manner as with Example 1.

These results are shown Table 1.

TABLE 1

| | Defect region in seed crystal | Dislocation-free rate (%) | Seed crystal-side slip occurrence rate (%) |
| --- | --- | --- | --- |
| Example 1 | Defect-free | 70 | 0 |
| Example 2 | Ring OSF | 50 | 30 |
| Example 3 | Interstitial Silicon excess | 60 | 20 |
| Comparative Example | Vacancy excess | 0 | 100 |

As shown in Table 1, the following facts are observable. Even though the single crystal pulling-up operations were carried out under the same conditions, the dislocation-free rate is 0% for the case where the seed crystal of a vacancy excess region was used (Comparative Example). In contrast, the dislocation-free rates are relatively high for all of the cases where the respective seed crystals of the ring OSF region, the defect-free region, and the interstitial silicon excess region were used (Examples 1 to 3).

Whereas, when the seed crystals each of a vacancy excess region were used (Comparative Example), slips occurred on the seed crystal side in every case. In contrast, for the other seed crystals (Examples 1 to 3), slips were apparently suppressed from occurring.

As for each seed crystal not including a vacancy excess region (Examples 1 to 3), it can be considered that the thermal shock resistance was improved as with the case where an impurity such as B was doped to a high concentration.

EXAMPLES 4 TO 6

By the use of seed crystals each of a defect-free region manufactured in the same manner as with Example 1, necking was carried out so that the necks respectively became a ring OSF region (Example 4), a defect-free region (Example 5), and an interstitial silicon excess region (Example 6) in the same manner as with Example 1, except that only the pull rate was controlled.

In the necking, each seed crystal was brought in contact with the raw material silicon melt surface, and then held at 8 mm in minimum diameter at a pull rate of 0.7 to 0.3 mm/min, thereby to grow a neck with a length of 20 mm.

Thereafter, the pull rate was increased to 1.5 mm/min, and the diameter was increased to 150 mm, thereby to pull up each single crystal ingot.

Each resultant single crystal ingot was evaluated for the dislocation-free rate.

These results are shown in Table 2.

Incidentally, as shown in Table 2, the defect region in the neck exists in a state mixed with a defect-free region as with a mixed ring OSF/defect-free region or a mixed interstitial silicon excess/defect-free region. This is due to the following fact. For the necking by a low-rate pulling-up, a defect-free region is formed in a region at a depth of several meters from the outer periphery of the neck due to the out-diffusion of point defects.

EXAMPLES 7 TO 9

By the use of the seed crystals each of a ring OSF region manufactured in the same manner as with Example 2, necking was carried out so that the necks respectively became a ring OSF region (Example 7), a defect-free region (Example 8), and an interstitial silicon excess region (Example 9) in the same manner as with Examples 4 to 6, except that only the pull rate was controlled. Then, single crystal ingots were pulled up.

Each resultant single crystal ingot was evaluated for the dislocation-free rate.

These results are shown in Table 2.

EXAMPLES 10 TO 12

By the use of the seed crystals each of an interstitial silicon excess region manufactured in the same manner as with Example 3, necking was carried out so that the necks respectively became a ring OSF region (Example 10), a defect-free region (Example 11), and an interstitial silicon excess region (Example 12) in the same manner as with Examples 4 to 6, except that only the pull rate was controlled. Then, single crystal ingots were pulled up.

Each resultant single crystal ingot was evaluated for the dislocation-free rate.

These results are shown in Table 2.

TABLE 2

| | Defect region in seed crystal | Defect region in neck | Dislocation-free rate (%) |
|---|---|---|---|
| Example 4 | Defect-free | Mixed ring OSF/defect-free | 90 |
| Example 5 | | Defect-free | 100 |
| Example 6 | | Mixed interstitial silicon excess/defect-free | 90 |
| Example 7 | Ring OSF | Mixed ring OSF/defect-free | 65 |
| Example 8 | | Defect-free | 70 |
| Example 9 | | Mixed interstitial silicon excess/defect-free | 65 |
| Example 10 | Interstitial silicon excess | Mixed ring OSF/defect-free | 70 |
| Example 11 | | Defect-free | 80 |
| Example 12 | | Mixed interstitial silicon excess/defect-free | 70 |

As shown in Table 2, it has been indicated that, distinct from the case where the seed crystal of a vacancy excess region was used (Comparative Example), the dislocation-free growth effects can be obtained also for any combination of seed crystals of other defect regions and necks of other defect regions.

In particular, in order to improve the dislocation-free rate with stability, it is preferably to grow a neck not including a vacancy excess region by the use of a seed crystal of a defect-free region. Especially, it can be said that the combination of a seed crystal of a defect-free region and a neck of a defect-free region is most suitable.

What is claimed is:

1. A method for manufacturing a silicon single crystal by single crystal pulling-up with a Czochralski method, comprising steps of:

using a seed crystal comprising a silicon single crystal without including a vacancy excess region;

growing a neck comprising a silicon single crystal without including a vacancy excess region with a diameter contracted smaller than, or equal to that of the contact surface of the silicon seed crystal in contact with a raw material silicon melt;

performing necking so that the length L of the neck satisfies $L \geq d \cdot (\cot \psi)$, where d denotes the length of the diameter or the diagonal of the contact surface of the silicon seed crystal in contact with the raw material silicon melt, and $\psi$ denotes the angle formed between the propagation direction of dislocations and the growth direction of the neck, and growing the silicon single crystal with the diameter expanded.

2. The method for manufacturing a silicon single crystal according to claim 1, wherein the neck is a silicon single crystal of a defect-free region without including a vacancy excess region, and without including an interstitial silicon excess region and a ring OSF region.

3. The method for manufacturing a silicon single crystal according to claim 2, wherein the contact surface of the silicon seed crystal comprises a silicon single crystal of a defect-free region.

4. The method for manufacturing a silicon single crystal according to claim 2, wherein the contact surface of the silicon seed crystal consists of a silicon single crystal of a defect-free region.

5. The method for manufacturing a silicon single crystal according to claim 2, wherein the contact surface of the silicon seed crystal comprises a silicon single crystal of a ring OSF region.

6. The method for manufacturing a silicon single crystal according to claim 2, wherein the contact surface of the silicon seed crystal comprises a silicon single crystal of an interstitial excess region.

7. The method for manufacturing a silicon single crystal according to claim 2, wherein in the necking step, the neck is formed with a diameter contracted smaller than or equal to a diameter of the contact surface until it is grown to at least the critical neck length Lc.

8. The method for manufacturing a silicon single crystal according to claim 2, wherein a minimum diameter of the neck is set at 6 mm or more.

9. The method for manufacturing a silicon single crystal according to claim 2, wherein a diameter of the neck is set equal to a diameter of the seed crystal.

10. The method for manufacturing a silicon single crystal according to claim 2, wherein the method is applied to a Magnetic field CZ method.

11. The method for manufacturing a silicon single crystal according to claim 1, wherein the neck comprises a silicon single crystal of a ring OSF region and a silicon single crystal of a defect-free region.

12. The method for manufacturing a silicon single crystal according to claim 1, wherein the neck comprises a silicon single crystal of an interstitial silicon excess region and a silicon single crystal of a defect-free region.

13. The method for manufacturing a silicon single crystal according to claim 1, wherein the contact surface of the silicon seed crystal comprises a silicon single crystal of a defect-free region.

14. The method for manufacturing a silicon single crystal according to claim 1, wherein the contact surface of the silicon seed crystal consists of a silicon single crystal of a defect-free region.

15. The method for manufacturing a silicon single crystal according to claim 1, wherein the contact surface of the silicon seed crystal comprises a silicon single crystal of a ring OSF region.

16. The method for manufacturing a silicon single crystal according to claim 1, wherein the contact surface of the silicon seed crystal comprises a silicon single crystal of an interstitial silicon excess region.

17. The method for manufacturing a silicon single crystal according to claim 1, wherein in the necking step, the neck is formed with a diameter contracted smaller than or equal to a diameter of the contact surface until it is grown to at least the critical neck length Lc.

18. The method for manufacturing a silicon single crystal according to claim 1, wherein a minimum diameter of the neck is set at 6 mm or more.

19. The method for manufacturing a silicon single crystal according to claim 1, wherein a diameter of the neck is set equal to a diameter of the seed crystal.

20. The method for manufacturing a silicon single crystal according to claim 1, wherein the method is applied to a Magnetic field CZ method.

* * * * *